United States Patent [19]
Mori

[11] Patent Number: 5,218,532
[45] Date of Patent: Jun. 8, 1993

[54] METHOD AND SYSTEM FOR ACQUIRING MR DATA IN MRI

[75] Inventor: Akio Mori, Ootawara, Japan

[73] Assignee: Kabushiki Kaisha Toshiba, Kawasaki, Japan

[21] Appl. No.: 489,901

[22] Filed: Mar. 7, 1990

[30] Foreign Application Priority Data

Mar. 17, 1989 [JP] Japan .................. 1-65571

[51] Int. Cl.⁵ .............................. G01R 33/20
[52] U.S. Cl. ........................ 128/653.2; 128/696; 324/309; 364/413.13
[58] Field of Search .............. 364/413.13, 413.02, 364/413.03, 413.15, 413.2; 324/307, 309, 313; 128/653 A, 696, 702, 708

[56] References Cited
U.S. PATENT DOCUMENTS

| 4,719,424 | 1/1988 | Jimbo et al. | 324/309 |
| 4,751,462 | 6/1988 | Glover et al. | 324/309 |
| 4,761,613 | 8/1988 | Hinks | 324/309 |
| 4,830,012 | 5/1989 | Riederer | 128/653 |
| 4,855,910 | 8/1989 | Bohning | 364/413.13 |
| 4,994,965 | 2/1991 | Crawford et al. | 364/413.15 |

Primary Examiner—Jerry Smith
Assistant Examiner—Paul Gordon
Attorney, Agent, or Firm—Foley & Lardner

[57] ABSTRACT

A change, e.g., a cardiac arrhythmia or a motion in a subject is monitored during an acquisition of MR data in an MRI apparatus, and it is determined whether or not a change occurs in the subject. If a change occurs, after an acquisition of the MR data, the MR data is reacquired in the encoding process when the change occurs, and the MR data in the corresponding encoding process is exchanged for the reacquired MR data. An MR image is reconstructed in accordance with MR data including the exchanged MR data, and an MR image which does not include an artifact due to a change in the subject is displayed.

6 Claims, 7 Drawing Sheets

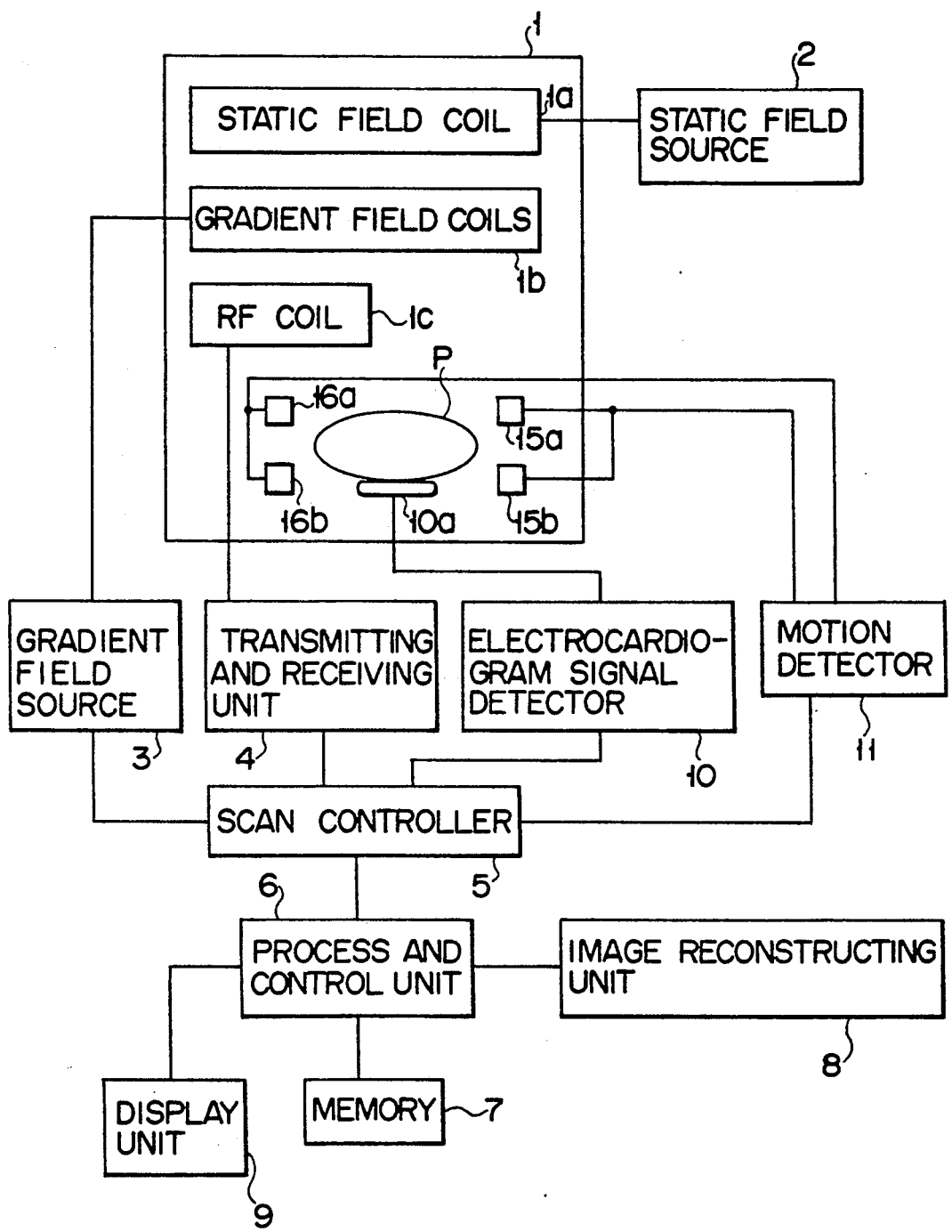
F I G. 2

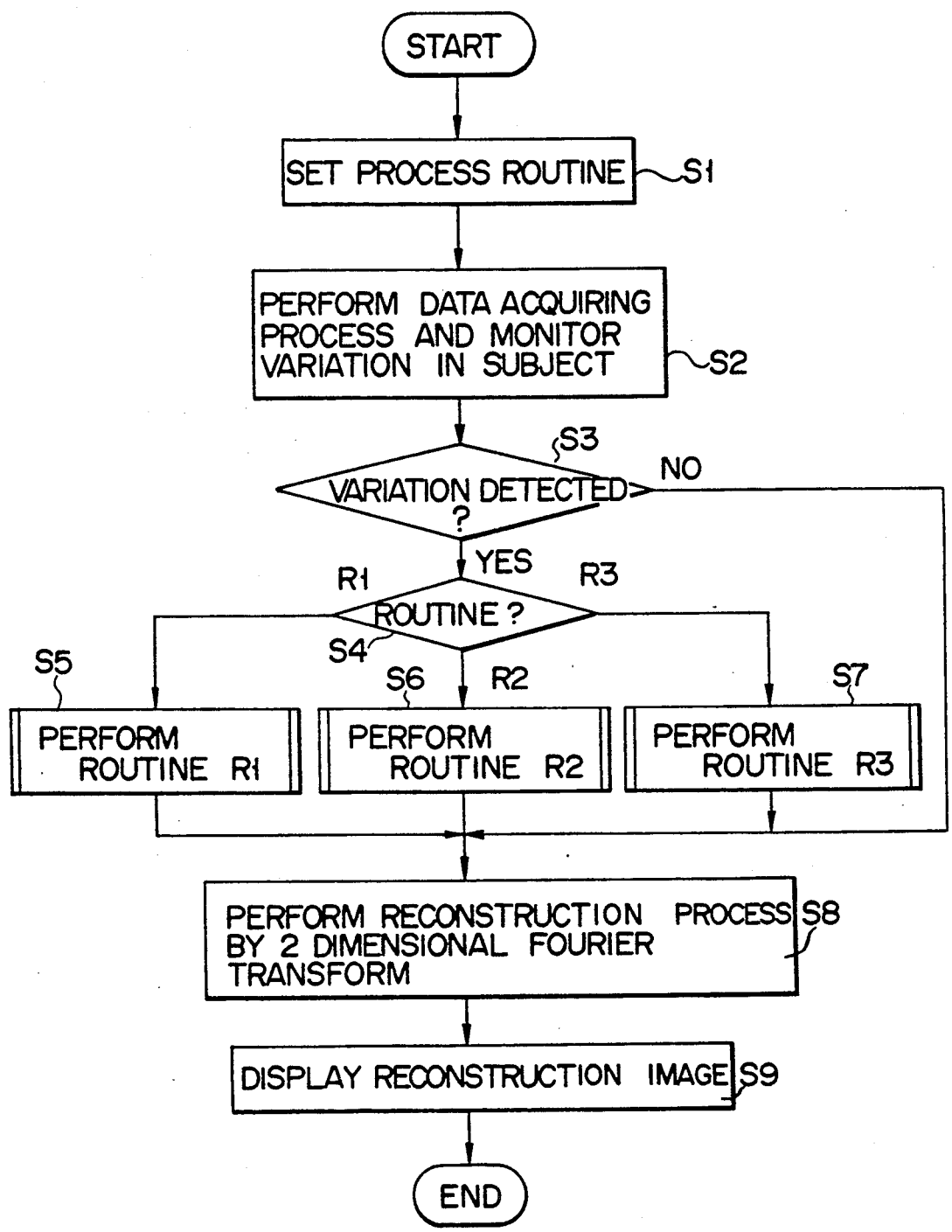
F I G. 3

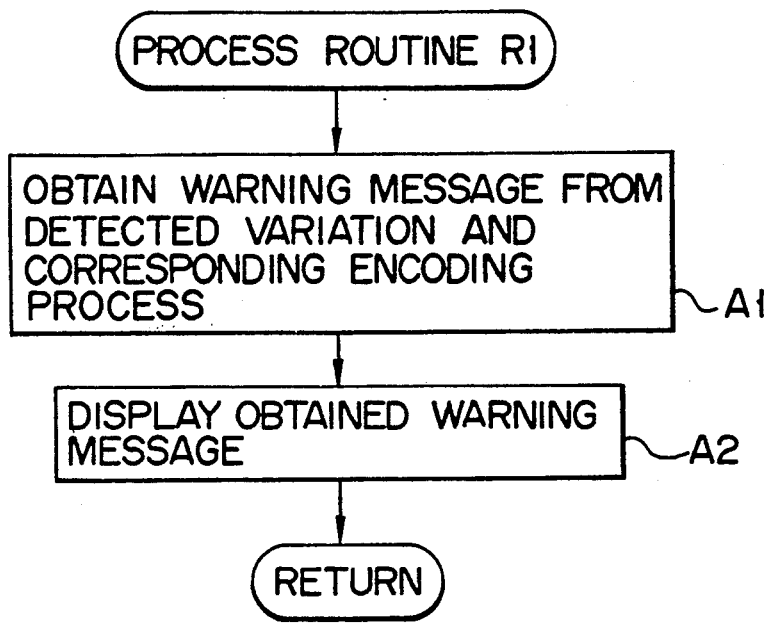
F I G. 4
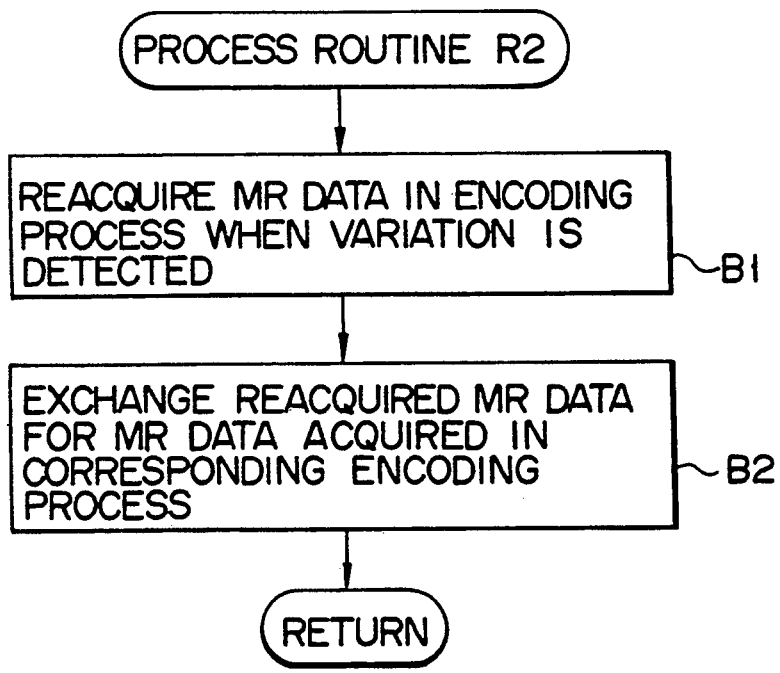
F I G. 6

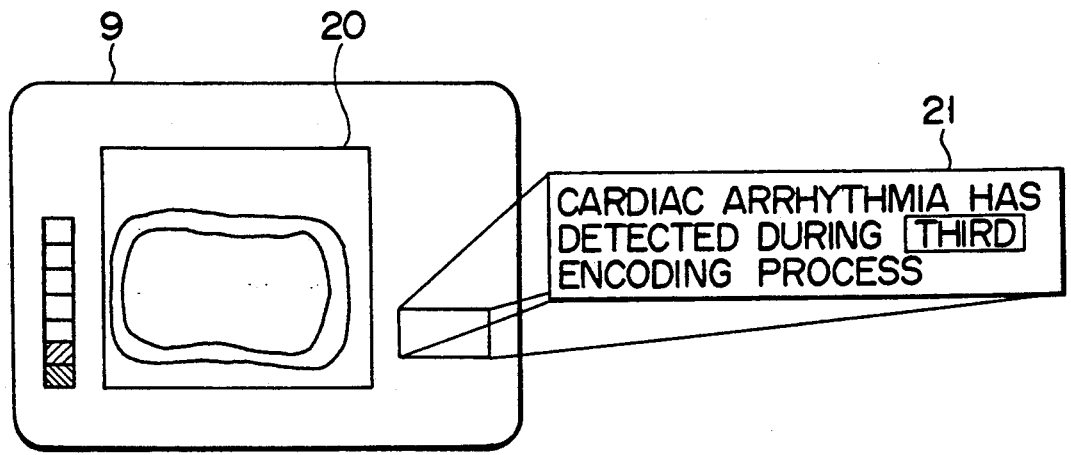
F I G. 5
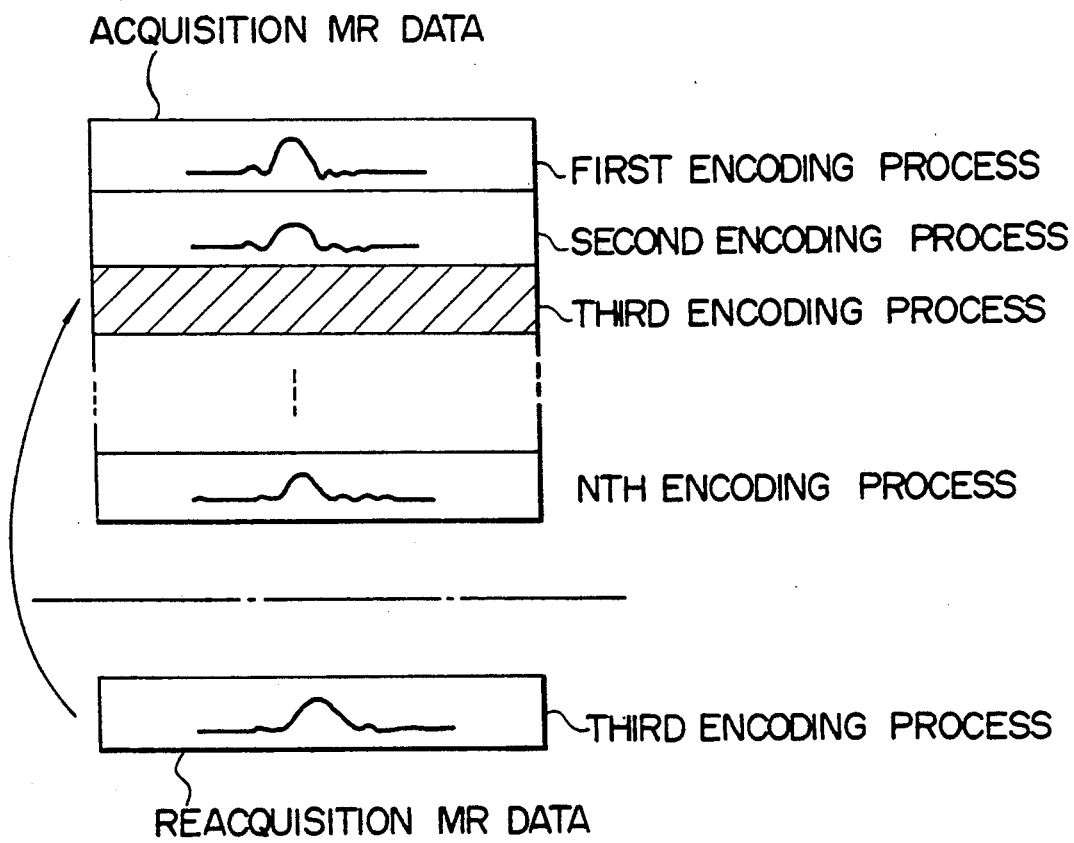
F I G. 7

METHOD AND SYSTEM FOR ACQUIRING MR DATA IN MRI

BACKGROUND OF THE INVENTION

1. Field of the Invention

The present invention relates to a method and system for acquiring magnetic resonance (MR) data in magnetic resonance (MR).

2. Description of the Related Art

An atomic nucleus, having a spin and a magnetic moment which are not zero, in a static field, resonance-absorbs and radiates only an electromagnetic wave with a specific frequency by a magnetic resonance phenomenon. This atomic nucleus resonates at an angular frequency $\omega 0$ ($\omega 0 = 2\pi\nu 0$; $\nu 0$ is the Larmor frequency) defined as follows:

$$\omega 0 = \nu H0$$

where $\nu$ is the gyromagnetic ratio which is inherent for each kind of an atomic nucleus, and H0 is the intensity of a static field.

In a magnetic resonance imaging (MRI) apparatus for diagnosing living bodies utilizing the magnetic resonance phenomenon, an MR signal induced after resonance absorption is detected and processed to acquire, without invasion, diagnosis data such as a slice image (MR image) of subject in accordance with, e.g., a density of atomic nuclei, longitudinal and transverse relaxation times periods, flow, and chemical shift.

Diagnosis data can be obtained on the basis of an MR signal generated by exciting the entire subject placed in a static field. In the conventional MRI apparatus, however, diagnosis data is obtained on the basis of an MR signal generated by exciting a specific portion of the subject in accordance with various limitations of the apparatus used and a specific clinical demand for an MR image.

In such an MRI apparatus, in order to reduce an artifact of an MR image due to motion and blood flow of a subject, beat-sync scanning is performed. In beat-sync scanning, for example, an R-wave of an electrocardiogram signal detected from the subject, on whom an electrocardiogram lead electrode is mounted, is used as a scanning sync signal, and MR data is acquired in accordance with the scanning sync signal.

Scanning for acquiring MR data in accordance with a beat sync signal to reconstruct one MR image will be described hereinafter with reference to FIG. 1.

As shown in FIG. 1, after a predetermined period of time (application timing period) Td elapses from generation of an R-wave of an electrocardiogram signal of a subject P, a trigger signal is generated to apply an RF (radio frequency) pulse by a spin echo method. The RF pulse is applied to a slice portion SL of the subject P in response to the trigger signal. An MR signal generated from the slice portion SL upon application of the RF pulse is acquired as MR data in a first encoding process. When RF pulses are sequentially applied to the slice portion, MR data of second, third, ... encoding processes are acquired.

For example, when an MR image having a 256×256 matrix is reconstructed, application of an RF pulse is repeated 256 times at a timing of generation of each trigger signal. Therefore, MR data associated with 256 encoding processes are acquired.

Note that, when intervals between adjacent R-waves are constant, a repetition time Tr of the RF pulse is also constant. However, when the intervals between R-waves are changed due to, e.g., arrhythmia in the fourth beat, the repetition time Tr of the RF pulse is changed into a repetition time Tr'.

When the repetition time Tr of the RF pulse is changed, the amplitude and phase of the MR signal are changed. MR data is changed in an encoding direction on an MR image in accordance with a change in amplitude and phase of the MR signal. Therefore, an artifact occurs in the encoding direction.

An averaging process is not taken into consideration in the above-mentioned MR data acquisition. However, when MR data is acquired in practice, an averaging process is performed in order to improve the S/N ratio. More specifically, a plurality of MR data acquired in a single encoding process are averaged. Therefore, the amplitude of a normal MR signal is always constant.

On the other hand, since the amplitude of a noise signal is irregular, the amplitude of the added noise signal is much less than that of the normal MR signal. Therefore, when the noise signal is averaged together with normal signal components, only a substantially normal MR signal can be acquired, thereby improving the S/N ratio.

However, during acquisition of MR data, if cardiac arrhythmia occurs in a subject or the subject moves, the amplitudes of MR signals obtained by the single encoding process are changed. Therefore, when the averaging process is performed, an S/N ratio is reduced.

In addition, when a change in the subject, e.g., cardiac arrhythmia or motion, is not monitored, an operator cannot determine whether or not the acquired MR image includes an artifact caused by a change in the subject.

Furthermore, if cardiac arrhythmia occurs in the subject or the subject moves, MR data must be reacquired. Therefore, it takes a long time period to acquire MR data.

Thus, an MRI apparatus is desirable which can show a change result of a subject to an operator if cardiac arrhythmia occurs in the subject or the subject moves during an acquisition of MR data, and which can reacquire MR data in the same encoding process when the subject is changed.

SUMMARY OF THE INVENTION

It is an object of the present invention to provide a method and system for acquiring MR data in MRI.

According to one aspect of the present invention, there is provided a method for acquiring MR data in MRI, the method comprising the steps of:

acquiring first MR data of a subject in accordance with a desired sequence having a plurality of encoding processes;

monitoring a state in the subject during an acquisition of the first MR data;

obtaining the encoding process when a change in the subject is detected;

acquiring second MR data in accordance with the obtained encoding process after acquisition of the first MR data is completed when the change in the subject is detected;

processing the first MR data in the obtained encoding process in accordance with the acquired second MR data; and reconstructing an MR image from the processed first MR data.

According to another aspect of the present invention, there is provided a system for acquiring MR data in MRI, the system comprising:

means for acquiring first MR data of a subject in accordance with a desired sequence having a plurality of encoding processes;

means for monitoring a state in the subject during an acquisition of the first MR data;

means for obtaining the encoding process when a change in the subject is detected;

means for acquiring second MR data in accordance with the obtained encoding process after the acquisition of the first MR data is completed when the change in the subject is detected;

means for processing the first MR data in the obtained encoding process in accordance with the acquired second MR data; and means for reconstructing an MR image from the processed first MR data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 2 is a block diagram showing an arrangement of a system according to an embodiment of the present invention;

FIG. 3 is a flow chart for explaining an operation of a process and control unit in the system according to the present invention;

FIG. 4 is a flow chart of the process routine R1;

FIG. 5 is a display example on a display unit after the process routine R1 is executed;

FIG. 6 is a flow chart of the process routine R2;

FIG. 7 is a view for explaining MR data acquisition by the process routine R2;

DETAILED DESCRIPTION OF THE PREFERRED EMBODIMENT

Figure 1:
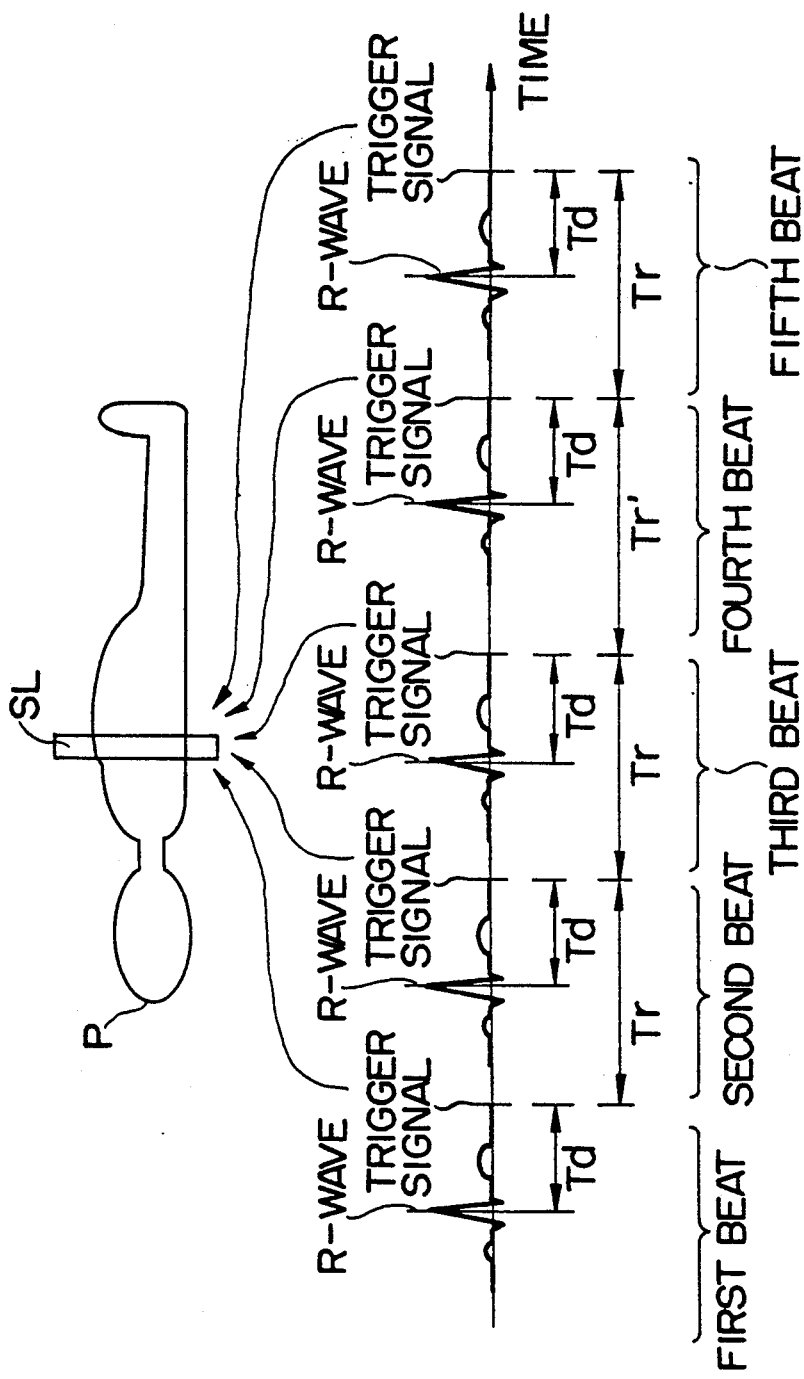
FIG. 1 is a view showing a slice portion of a subject, and a timing chart showing application timings of electrocardiogram signals and RF pulses.

An embodiment of the present invention will be described hereinafter with reference to the accompanying drawings.

As shown in FIG. 2, a system according to the present invention includes a magnetic field generating coil unit 1, a static field source 2, a gradient field source 3, a transmitting and receiving unit 4, a scan controller 5, a process and control unit 6, a memory 7, an image reconstructing unit 8, a display unit 9, an electrocardiogram signal detector 10, and a motion detector 11.

The magnetic field generating coil unit 1 includes a static field coil 1a, gradient field coils 1b, and an RF coil 1c. A subject P is positioned in the coil unit 1. Note that either a transmitting and receiving coil or a transmitting coil and a receiving coil are used as the RF coil 1c.

The static field source 2 supplies power to the static field coil 1a for generating a static field.

The gradient field source 3 supplies power to the gradient field coils 1b for generating gradient fields in x, y and z directions.

The transmitting and receiving unit 4 transmits an RF pulse to the RF coil 1c so as to apply an RF pulse to the subject P and receives an MR signal detected by the RF coil 1c.

The scan controller 5 controls the gradient field source 3, the transmitting and receiving unit 4, the electrocardiogram signal detector 10, and the motion detector 11 in accordance with a predetermined control sequence.

The process and control unit 6 controls the scan controller 5, the memory 7, the image reconstructing unit 8, and the display unit 9.

The memory 7 stores MR signals acquired in each encoding process as MR data. Note that the memory 7 also stores data associated with scanning conditions e.g., a scan portion of the subject P.

The image reconstructing unit 8 reconstructs an MR image by performing, e.g., Fourier transform with respect to the MR data stored in the memory 7.

The display unit 9 displays the MR image reconstructed by the image reconstructing unit 8.

The electrocardiogram signal detector 10 detects an electrocardiogram signal from the subject P on whom an electrocardiogram lead electrode 10a is mounted, and generates a beat sync signal shown in FIG. 1 as a trigger signal on the basis of the electrocardiogram signal. The trigger signal is input to the scan controller 5 to generate an RF pulse. In addition, the electrocardiogram signal detector 10 detects the presence/absence of cardiac arrhythmia on the basis of the detected electrocardiogram signal and outputs data representing the detection result to the scan controller 5.

The motion detector 11 detects the presence/absence of a motion of the subject P and outputs data representing the detection result to the scan controller 5. For example, optical transmitters 15a and 15b and optical receivers 16a and 16b are arranged at predetermined positions around the subject P. The motion detector 11 detects whether or not light respectively emitted from the transmitters 15a and 15b toward the receivers 16a and 16b are interrupted by the subject P. Data representing the determination result is input to the scan controller 5.

An operation of this system will be described hereinafter.

In this system, acquisition of MR data, detection of a change in the subject, and reconstruction of an image are performed following a flow chart shown in FIG. 3.

In step S1, the process routine R1, R2, or R3 is set. The process routines R1, R2, and R3 are executed if cardiac arrhythmia occurs in the subject or the subject moves during an acquisition of an MR signal from a predetermined portion of the subject in synchronism with heart beats of the subject.

In step S2, an MR data acquiring process is performed under the control of the scan controller 5. The acquired MR data is stored in the memory 7. In addition, a change in the subject during an acquisition of MR data is monitored by the electrocardiogram signal detector 10 and the motion detector 11.

In step S3, it is determined whether or not a change in the subject is detected during MR data acquisition.

If a change in the subject is not detected during MR data acquisition in step S3, a reconstruction process is performed by 2 dimensional Fourier transform in the image reconstructing unit 8 in step S8. In step S9, the reconstruction image is displayed by the display unit 9.

When a change in the subject is detected during MR data acquisition in step S3, data associated with the encoding process performed when the change occurs is stored in the memory 7.

In step S4, it is determined which process routine is set in step S1.

If the process routine R1 is set, the process routine R1 is executed in step S5 in accordance with a flow chart shown in FIG. 4.

In step A1, data associated with the encoding process is read out from the memory 7, and the readout data is input to the display unit 9.

In step A2, a warning message is generated in accordance with the detection result, and the obtained message is input to the display unit 9.

After the process routine R1 is completed, the image reconstruction process is performed in step S8. As shown in FIG. 5, in step S9, the readout data associated with the encoding process and a warning message 21 are displayed on the display nit 9 together with a reconstructed image 20.

If it is determined in step S4 that the process routine R2 is set, the process routine R2 is executed in step S6 in accordance with a flow chart shown in FIG. 6.

In step B1, data associated with the encoding process stored in the memory 7 is read out, and MR data in this encoding process is reacquired.

As shown in FIG. 7, in step B2, the reacquired MR data is exchanged for the MR data previously acquired in the corresponding encoding process.

After the process routine R2 is completed, the image reconstruction process is performed (step S8), and the reconstructed image is displayed (step S9).

Figure 8:
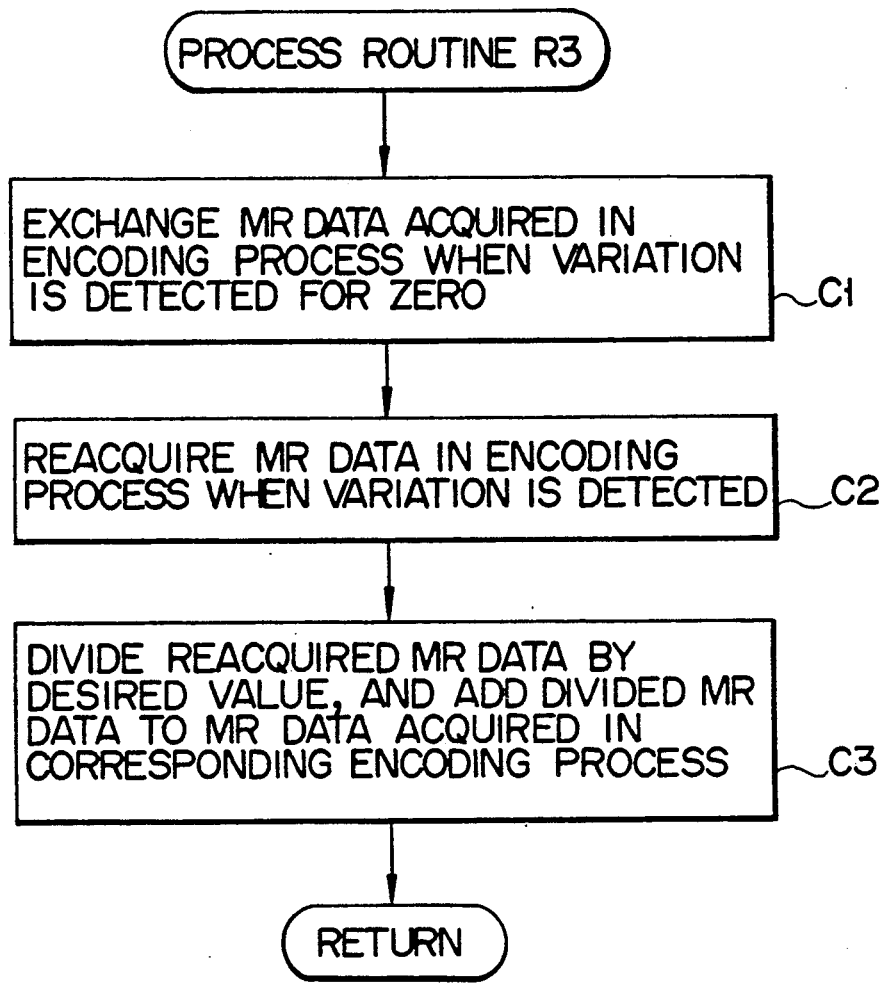
FIG. 8 is a flow chart of the process routine R3.
Figure 9:
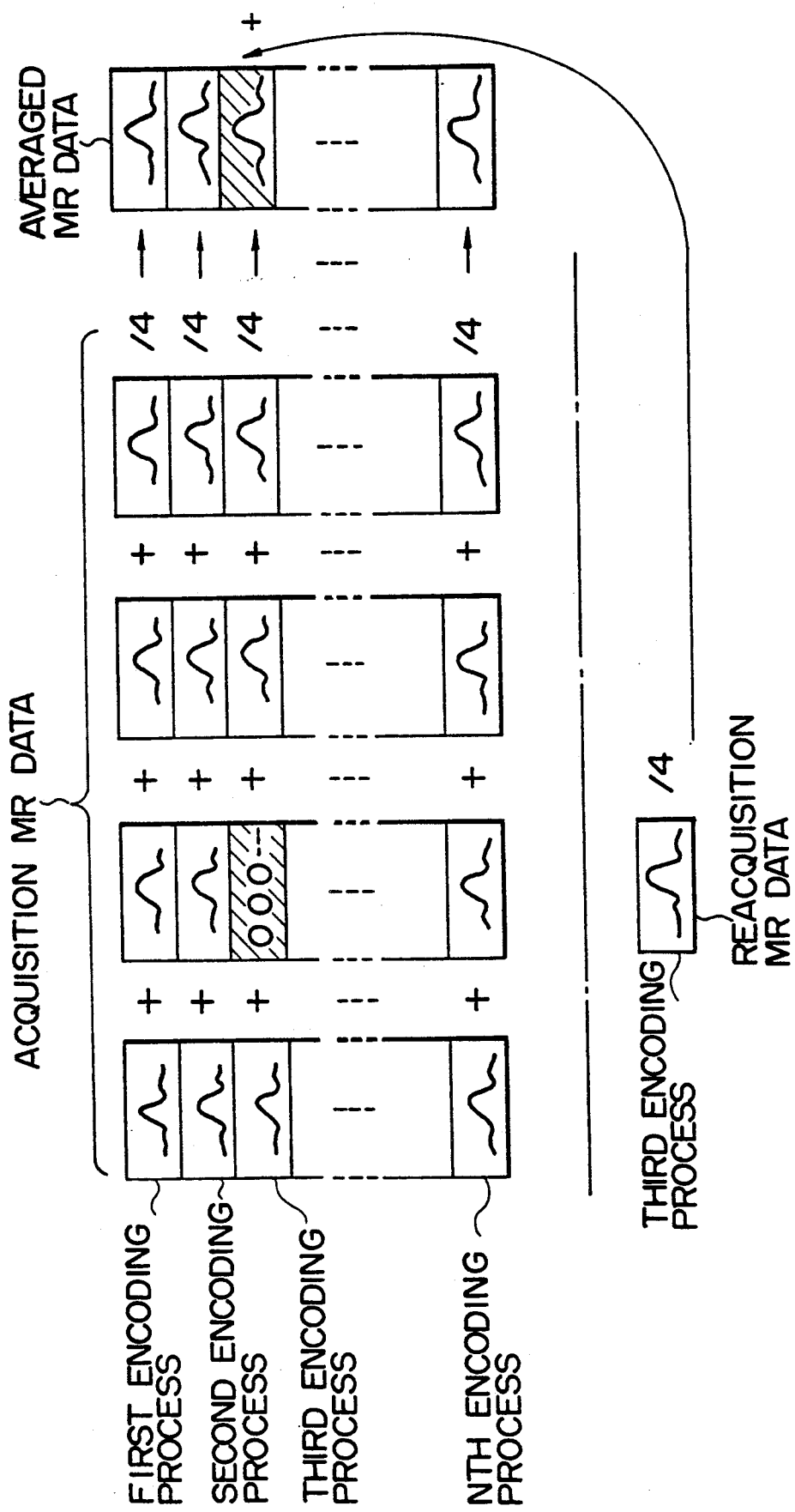
FIG. 9 is a view for explaining MR data acquisition by the process routine R3.

If it is determined in step S4 that the process routine R3 is set, the process routine R3 is executed in step S7 in accordance with a flow chart shown in FIG. 8. Note that FIG. 9 shows a case wherein the averaging process is performed four times for MR data acquistion in each encoding process.

In step C1, data associated with the encoding process stored in the memory 7 is read out, and the MR data acquired in this encoding process is exchanged for zero.

In step C2, MR data in this encoding process is reacquired.

In step C3, the reacquired MR data is divided by a predetermined value. In addition, the divided MR data is added to the MR data which is previously acquired in the corresponding encoding process. Note that the predetermined value is set in advance in accordance with the data associated with the encoding process stored in the memory 7.

After the process routine R3 is completed, an image reconstruction process is performed (step S8), and the reconstructed image is displayed (step S9).

Thus, if cardiac arrhythmia occurs in the subject or the subject moves, an operator can know than the displayed reconstructed image includes an artifact. In addition, a reconstructed image which does not include an artifact due to a change in the subject can be displayed.

Although execution of one process routine of the process routines R1, R2, and R3 has been described in this embodiment, the process routine R1 can be combined with the process routine R2, or the routine R1 can be combined with the process routine R3.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. A method for acquiring MR data in MRI, said method comprising the steps of:
   acquiring first MR (magnetic resonance) data of a subject by performing a desired sequence having a plurality of encoding processes;
   monitoring a state of said subject during acquistion of said first MR data;
   storing data associated with an encoding process of said encoding processes performed when a change in said state of said subject occurs;
   repeating said acquiring step, said monitoring step and said storing step a plurality of times;
   acquiring second MR data of said subject by performing said encoding process after acquistion of said first MR data is completed when said change in said state of said subject occurs;
   changing at least one data item of said first MR data in said encoding process into zero data;
   averaging said first MR data other than said at least one data item in said encoding process and said zero data to obtain averaged first MR data;
   dividing said second MR data by a predetermined value to obtain a quotient of MR data;
   adding said quotient of MR data to said averaged first MR data in said encoding process to obtain first summation MR data; and
   reconstructing an MR image from said first summation MR data.

2. The method according to claim 1, wherein said monitoring step includes a step of detecting electrocardiogram signals from said subject.

3. The method according to claim 1, wherein said monitoring step includes a step of detecting motion of said subject.

4. A method for acquiring MR data in MRI, said system comprising:
   means for acquiring first MR data of a subject by performing a desired sequence having a plurality of encoding processes;
   means for monitoring a state of said subject during acquistion of said first MR data;
   means for storing data associated with an encoding process of said encoding processes performed when a change in said state of said subject occurs;
   means for acquiring second MR data of said subject by performing said encoding process after acquistion of said first MR data is completed when said change in said state of said subject occurs;
   means for changing at least one data item of said first MR data in said encoding process into zero data;
   means for averaging said first MR data other than said at least one data item in said encoding process and said zero data to obtain averaged first MR data;
   means for dividing said second MR data by a predetermined value to obtain a quotient of MR data;

mean for adding said quotient of MR data to said averaged first MR data in said encoding process to obtain first summation MR data; and means for reconstructing an MR image from said first summation MR data.

5. The system according to claim 4, wherein said monitoring means includes means for detecting electrocardiogram signals from said subject.

6. The system according to claim 4, wherein said monitoring means includes means for detecting motion of said subject.

* * * * *